US005339057A

United States Patent [19]

Rauscher

[11] Patent Number: 5,339,057

[45] Date of Patent: Aug. 16, 1994

[54] LIMITED BANDWIDTH MICROWAVE FILTER

[75] Inventor: Christen Rauscher, Alexandria, Va.

[73] Assignee: The United States of America as represented by the Secretary of the Navy, Washington, D.C.

[21] Appl. No.: 25,210

[22] Filed: Feb. 26, 1993

[51] Int. Cl.$^5$ ........................ H03H 15/00; H03H 7/38

[52] U.S. Cl. ..................................... 333/166; 333/202

[58] Field of Search ................................ 333/165-168, 333/202, 109, 110, 128, 126, 127, 129, 132, 134, 136

[56] References Cited

U.S. PATENT DOCUMENTS

| | | | |
|---|---|---|---|
| 2,897,442 | 7/1959 | Wright et al. | 333/166 X |
| 3,737,813 | 6/1973 | Buecherl | 333/167 |
| 4,238,766 | 12/1980 | Masuda | 333/132 X |
| 4,542,524 | 9/1985 | Laine | 333/168 X |
| 4,639,694 | 1/1987 | Seino et al. | 333/128 |
| 4,661,789 | 4/1987 | Rauscher | 333/202 |
| 5,001,445 | 3/1991 | Horvath et al. | 333/166 |
| 5,021,756 | 6/1991 | Tajima et al. | 333/132 |

FOREIGN PATENT DOCUMENTS

| | | | |
|---|---|---|---|
| 0312463 | 4/1989 | European Pat. Off. | 333/166 |

OTHER PUBLICATIONS

Rauscher, "Distributed Microwave Active Filters with GaAs FETs," IEEE Int. Microwave Symp. Digest, Jan. 85.

Rauscher, "Microwave Active Filter Based on Transversal and Recursive Principles," IEEE Trans. on Microwave Theory and Techniques, vol. MIT-33, No. 12, pp. 1350-1360, Dec. 85.

Schindler et al., "A Novel MMIC Active Filter with Lumped and Transversal Elements," IEEE Trans. on Microwave Theory and Techniques, vol. 37, No. 12, pp. 2148-2153, Dec. 89.

Matthaei et al., "Microwave Filters, Impedance-Matching Networks, and Coupling Structures," MacGraw-Hill Book Co., Sec. 17.07, pp. 1043, 1964.

Jutzi, "Microwave Bandwidth Active Transversal Filter Concept with MESFETs," IEEE Trans. on Microwave Theory and Techniques, MIT-19, No. 9, pp. 760-767, Sep. 1971.

Hunter et al., "Electronically Tunable Microwave Bandstop Filters," IEEE Trans. on Microwave Theory and Techniques, MIT-30, No. 9, pp. 1361-1367 Sep. 1982.

Adams et al., "Active Filters for UHF and Microwave Frequencies", IEEE Trans. on Microwave Theory and Techniques, MIT-17, No. 9, pp. 662-670, Sep. 69.

Snyder et al., "Analysis and Design of a Microwave Transistor Active Filter," IEEE Trans. on Microwave Theory and Techniques, MIT-18, No. 1, pp. 2-9, Jan. 70.

*Primary Examiner*—Seungsook Ham

*Attorney, Agent, or Firm*—Thomas E. McDonnell; Charles J. Stockstill

[57] ABSTRACT

A limited-bandwidth microwave transversal or recursive filter, compatible with microwave monolithic integrated circuit (MMIC) design requirements is described in this invention. The device comprises a means to split an incident signal into multiple parts for distribution among a plurality of input ports of frequency-selective feedforward and feedback network branches comprising filter elements and active devices so designed as to provide a desired degree and type of signal filtration. After filtration, the resulting signals from these branches are combined to form a composite filter output signal.

28 Claims, 7 Drawing Sheets

LIMITED BANDWIDTH MICROWAVE FILTER

FIELD OF THE INVENTION

The present invention relates generally to microwave filters and more particularly to filters with limited bandwidth which are compatible with microwave monolithic integrated circuit (MMIC) design requirements.

BACKGROUND OF INVENTION

Conventional passive microwave filters consist of appropriately coupled or connected transmission line segments, which, in a monolithic integrated circuit environment, consume a disproportionate amount of chip area and are hence not well suited for on-chip integration and, also, do not take advantage of the semiconducting properties of the substrate material. Critical chip area may be conserved by resorting to lumped-element filter configurations (involving inductors, capacitors, resistors, etc.), but only at the cost of incurring appreciably higher signal transmission losses and poorly defined passband edges.

In the prior art, an obvious solution to these problems has been to combine space-saving lumped-element circuitry with on-chip amplifying devices so as to compensate for the lumped-element-derived derived losses. One approach has been to employ the familiar active filter techniques used at audio frequencies, involving high-gain amplifiers and lumped-element embedding circuitry. This approach, however, is not practical at microwave frequencies due to the lack of sufficient gain in the available active devices and the presence of large signal time delays associated with these devices. Alternative approaches have been to encompass the use of transistor circuits with positive feedback to establish negative resistance characteristics for the purpose of loss compensation. In these circuits, the drawback lies with their inherent susceptibility to oscillation, especially when narrow bandwidths are involved.

An approach to circumvent the above stated problem with oscillation is set forth in U.S. Pat. No. 4,661,789, where the filter structures are based on transversal and recursive principles. Filtering action is achieved through frequency-dependent constructive and destructive interference engineered among signal components derived from the signal input and subjected to differing amounts of time delay and amplitude weighting. Mathematically, the transfer function of such a filter is described as a polynomial or rational function of terms composed of products of frequency-independent weighting factors and complex exponential functions with frequency-proportional arguments. This approach is particularly attractive for microwave applications, as it neither requires high-gain amplifiers, nor is it hampered by long time delays intrinsic to currently utilized active devices. However, in narrow-band situations where larger amounts of aggregate time delay are required than can readily be realized in a practical circuit with simple transmission lines or lumped-element approximations thereof another solution must be sought.

Prior art transversal and recursive filters have typically contained a designated main signal path with transfer characteristics of the same type as those sought for the overall filter, but lacking adequate frequency selectivity. For instance, if the overall filter is to exhibit bandpass behavior with sharp cutoff properties, the main signal path would typically show bandpass behavior, but without well defined filter lower and upper cutoff frequency characteristics.

In prior art situations, filter sections have been positioned within transversal and recursive structures so as to affect deliberately and principally the amplitude properties of the main signal path. Depending on the selected arrangement, other auxiliary transversal or recursive signal paths are also affected by the filter sections, but to subordinated degree.

The prior art has no more than one signal transfer branch that is both common to only a single signal path and also deliberately contains frequency-selective componentry. In the prior art there are no transversal band-reject microwave filters.

The prior art, employing mostly signal paths with nonselective or only weakly selective frequency behavior, necessitates a large number of transversal branches to achieve acceptable overall filter frequency selectivity in narrowband situations, thus resulting in large structures.

SUMMARY OF THE INVENTION

It is an object of the present invention to provide for the incorporation of means to mimic long signal time delays over limited frequency ranges without necessitating commensurately long transmission line segments, thereby providing the key to realizing narrowband transversal and recursive filters in a practical and compact form.

A further object of the present invention is to apply the disclosed filtering techniques to any type of filtering requirement, including low-pass, band-pass, high-pass, band-reject, and all-pass situations.

These and other objects are achieved by a circuit means to distribute a transversal filter input signal among input ports of two-port network branches, as well as a circuit means to combine signals at output ports of such branches to form a transversal filter output signal. The array of two-port branches contains either two or more feedforward branches with frequency-selective signal transfer characteristics or, in the alternative, the feedforward branches contain one or more principal branches yielding a low-order or zeroth-order approximation to a specified overall transversal filter magnitude response. This is in conjunction with one or more auxiliary feedforward branches that exhibit band-edge signal transfer cut-off characteristics more abrupt than those of the low-order approximation. Transversal filter responses and individual branch transfer responses can be low-pass, bandpass, high-pass, band-reject or all-pass—with bandpass branch responses particularly useful—while involving lumped-element, distributed element, or lumped-distributed-element implementations.

Furthermore, the present invention encompasses a microwave recursive filter design that is analogous to the transversal filter, but with frequency-selective feedback branches employed either in addition to or in place of frequency-selective feedforward branches, and with circuit means to guide feedforward and feedback signals in the appropriate directions.

BRIEF DESCRIPTION OF THE DRAWINGS

FIGS. 4(*a*) and 4(*b*) are expanded views of the input and output coupling networks of FIG. 4.

FIG. 7(*b*) depicts a magnetically-tuned yttrium-iron-garnet (YIG)-based multipole planar bandpass filter.

DETAILED DESCRIPTION OF THE PREFERRED EMBODIMENTS

The present invention encompasses a microwave transversal or recursive filter arrangement that supports multiple paths between filter input and filter output through an array of individual twoport network branches with optional mutual signal coupling among selected branches.

Figure 1:
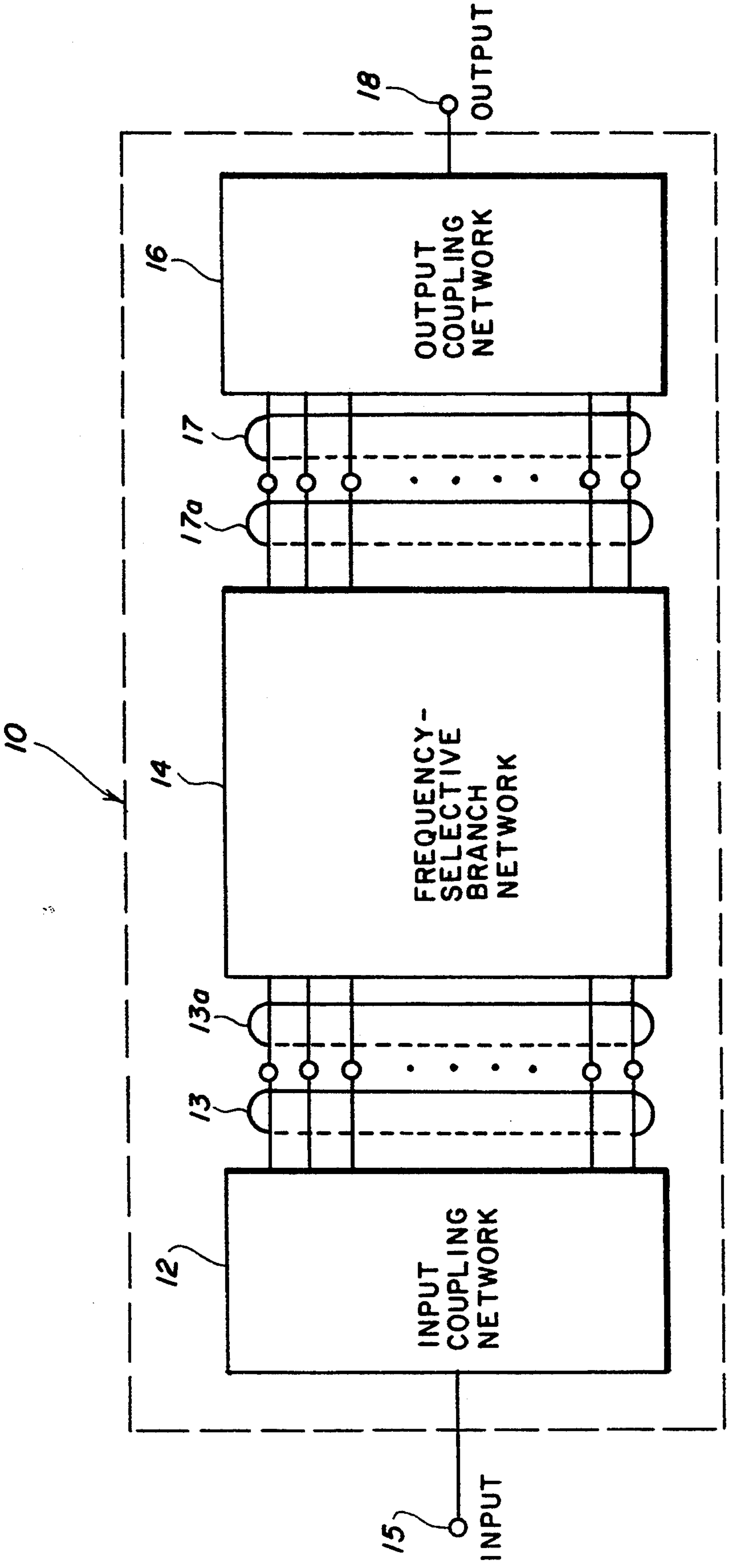
FIG. 1 is a schematic block diagram of the invention.

The limited bandwidth microwave filter 10 is conceptionally composed of three main subnetworks, as shown in FIG. 1—an input coupling network 12, a frequency-selective branch network 14, and an output coupling network 16. Each subnetwork may include appropriate amplifying devices or other nonreciprocal devices to boost pertinent signal levels, to provide signal isolation between selected subnetwork ports, or to prevent undesired interactions among pertinent signal components.

An input coupling network 12 is comprised of one primary or input port 15 and a multiplicity of secondary ports 13 designed to distribute a signal incident on the primary port 15 (the composite filter input port) among designated secondary ports 13 and to control distribution of signals incident on any one given secondary port 13 to other secondary ports 13 and to the input port 15.

The output coupling network 16 is comprised of a multiplicity of primary ports 17 and one output or secondary port 18, or the composite filter output, designed to combine signals incident on the primary ports 17 into a composite signal output appearing at the secondary port 18 and to control distribution of signals incident on a primary port 17 or the secondary port 18 to other primary ports 17.

The input and output coupling networks 12 and 16, respectively, will typically be comprised of transmission line sections for adjustment of signal phasing, power splitters and combiners, with or without isolation resistors, and directional couplers of various types for establishing desired interactions among designated signal components, nonreciprocal elements, and various lumped and distributed circuit elements for impedance matching and signal phasing purposes.

The frequency-selective branch network 14 may encompass transmission line sections and nonreciprocal elements, but most importantly it contains individual filtering structures of differing frequency selectivity. A main purpose of the filtering structures is to establish individual signal branches exhibiting differing degrees of rapidly changing transmission phases as functions of frequency. These structures can mimic, over limited frequency bands, the phase characteristics of very long transmission lines, such as would be required in the prior art narrowband transversal and recursive filters, yet consume only a fraction of the circuit area otherwise needed. A simple resonator with input and output coupling is an example of a structure that provides rapid phase change versus frequency. This invention would typically use filtering structures made up of multiple resonator sections appropriately coupled together.

In a typical branch of the frequency-selective branch network 14, an array of individual two-port channels, each having a primary (input) port 13*a* and a secondary (output) port 17*a*, connect the respective secondary (output) ports 13 of the input coupling network 12 to the respective primary (input) ports 17 of the output coupling network 16. Two or more of these channels, or branches, exhibit directional signal transfer characteristics whose frequency-selective, non-linear-phase amplitude and phase responses as functions of frequency differ from branch to branch. Directionality is either established within the branch network through use of nonreciprocal circuit elements, established through the directional signal distribution properties of input and output coupling networks 12 and 16, respectively, or established by the branch network 14 in collaboration with either one or both of the coupling networks 12 and 16, respectively.

In the present invention, the technical approach disclosed has limited bandwidth over which the rapidly changing desired phase characteristics of individual frequency-selective branches can be maintained and narrowband magnitude characteristics that invariably go along with the phase responses. These frequency-selective characteristics are an essential ingredient of the invention in that they can concentrate desired effects at specific critical frequency points and thus locally help shape the magnitude and phase properties of an overall filter response. The rapid phase changes versus frequency associated with each of the frequency-selective filter components contained in the multiport branch network, as well as the frequency selectivity of their amplitude characteristics, all combine to yield an efficient and very compact overall transversal, recursive, or mixed-transversal-recursive filter design.

Mathematically, the pertinent transfer functions are polynomials or rational functions of magnitude-weighted exponential terms where the weighting factors vary distinctly with frequency and the exponential arguments generally are not frequency-proportional, as they are in prior art transversal and recursive filters.

The frequency-selective branch network 14 constitutes a critical part of the overall limited bandwidth microwave filter 10, and the preferred embodiments. In a typical implementation, the multiport network 14 consists of an array of individual branches comprising cascade connections of active elements and passive filter segments. Deliberate mutual signal coupling among such branches may be incorporated as part of the invention, if desirable. Individual passive filter segments contained in the frequency-selective branch network 14 may be of the low-pass, highpass, band-pass, band-reject and all-pass type, and may involve distributed circuit elements (transmission line elements), lumped circuit elements, and combinations thereof. The active elements may consist of off-the-shelf microwave monolithic integrated circuit (MMIC) amplifiers, allowing for a building-block approach to microwave active filter design, as used in the audio range, but based on very different principles.

Figure 2:
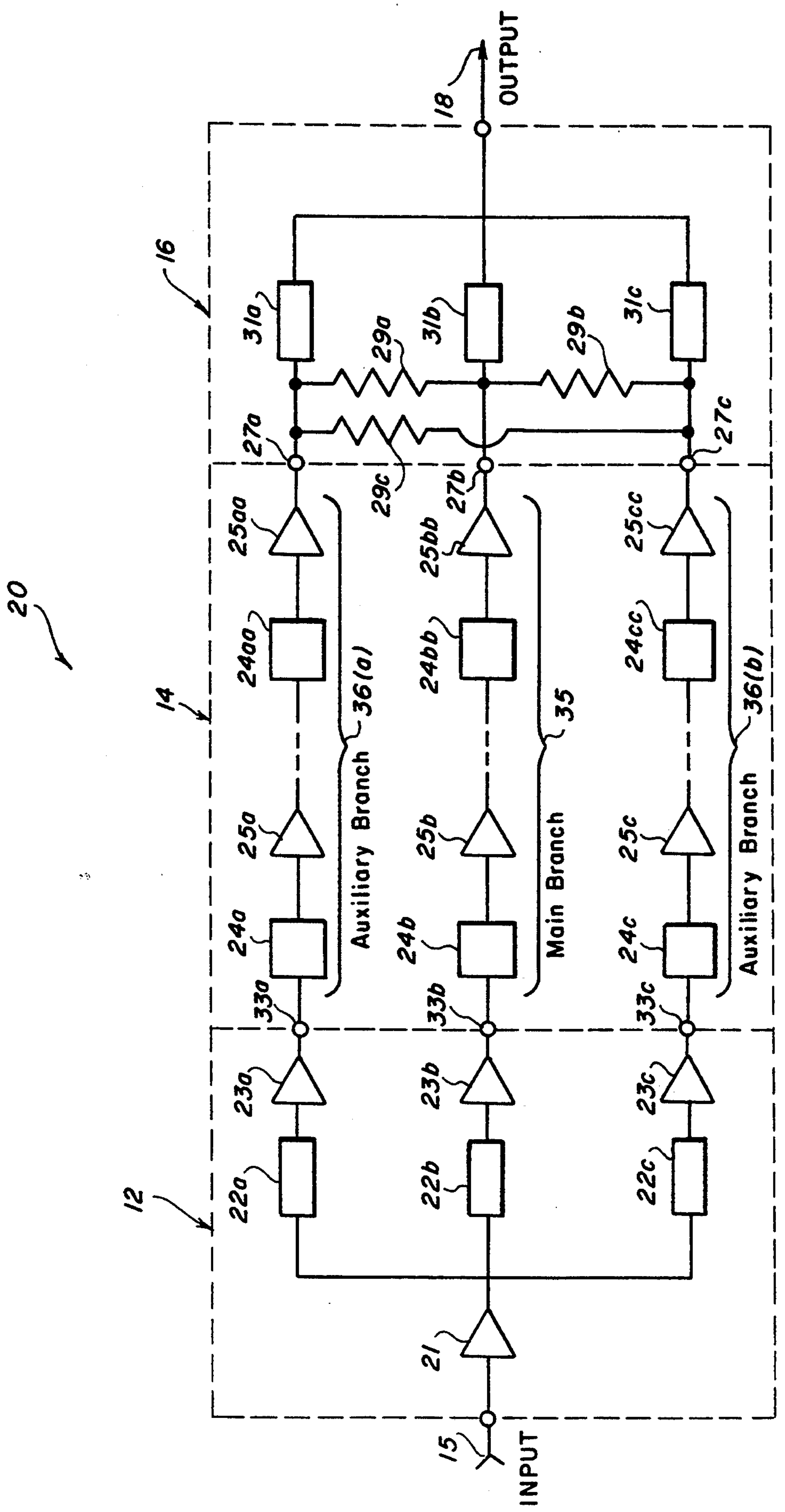
FIG. 2 is a schematic block diagram of an exemplary three-branch transversal filter.

A first preferred embodiment, as shown in FIG. 2, is a three-branch transversal filter 20 design with isolation resistors 29*a*, 29*b* and 29*c* where all branches of the input coupling network 12, the frequency-selective branch network 14 .and the output coupling network 16 (described and discussed in relation to FIG. 1) provide signal transmission in a forward direction. The common direction for all signal components is maintained by a common orientation of the isolating active elements. The input and output coupling networks 12 and 16, respectively, have in-phase power splitting and combining, as well as preamplification as part of input coupling network 12 to minimize the overall noise figure. Further, in this embodiment, it is noted that all the element parameters, including the amplifier gains, differ from branch to branch.

In the first preferred embodiment of the three-branch transversal filter 20, as shown in FIG. 2, the output of a preamplifier 21 (comprised of a MMIC amplifier, such as Model TGA 8021, manufactured by Texas Instruments, Inc. of Dallas TX) together with additional input and output matching circuitry, contained in input coupling network 12, branches into three output transmission line segments 22*a*, 22*b* and 22*c* which respectively match the input impedances of amplifiers 23*a*, 23*b* and 23*c* (Manufacturer's Part No. EG-6345, manufactured by Texas Instruments, Inc. of Dallas. TX) and provide signal phase adjustments. In the amplifiers 23*a*, 23*b* and 23*c*, respective signal components are amplified to precompensate for subsequently incurred signal transmission losses.

Output ports 33*a*, 33*b* and 33*c* of the input coupling network 12 are connected to the filter segments 24*a*, 24*b* and 24*c* in the frequency-selective branch network 14 to present signal components propagating through respective branches with differing phase shifts and amplitude variations versus frequency. The frequency-selective branch network 14 consists of two or more filter networks 24*a*, 24*b* and 24*c* and amplifiers 25*a*, 25*b* and 25*c* to affect overall transversal filtering through constructive and destructive interactions among branch signal components that have been subjected to pertinent phasing and amplitude weighting. Multiple filter sections (i.e., 24*bb* and 25*bb*) in the main branch 35 and in the auxiliary branches 36*a* and 36*b* (i.e., 24*aa*, 25*aa* and 24*cc*, 25*cc*, respectively) may be used to achieve overall filter response characteristics of suitable selectivity, with higher-order filter characteristics obtained for higher numbers of filter sections in each branch.

Upon completion of the desired filtration, the output of each of the branches is coupled to the transmission line segments 31*a*, 31*b* and 31*c* at the input ports 27*a*, 27*b* and 27*c* of the output coupling network 16. The impedance is matched in transmission line segments 31*a*, 31*b* and 31*c* to the line impedance of the output 18. Isolation resistors 29*a*, 29*b* and 29*c* are connected between input circuits of the coupling network 16 analogous to the way such resistors are used in common two-way Wilkinson-type signal splitters and combiners.

Figure 3:
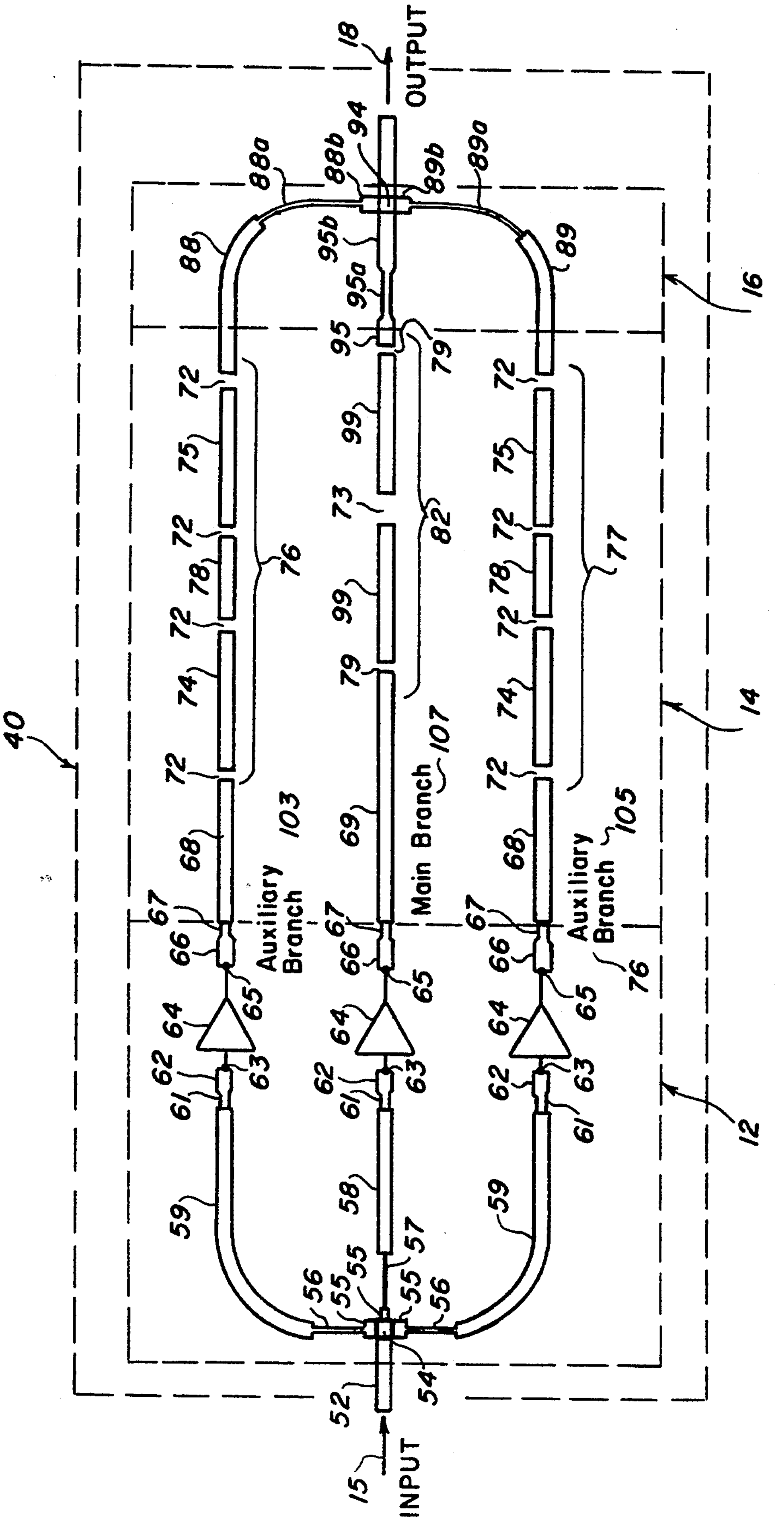
FIG. 3 is a schematic circuit diagram of an exemplary three-branch transversal bandpass filter.

A second preferred embodiment of the invention is shown in FIG. 3 by the mask layout of a microstrip one-percent-bandwidth three-branch transversal bandpass filter 40, without power splitter 98 and power combiner 138 isolation resistors and is referred to as the Mark I (Mk I) version of the filter. The input and output coupling networks 12 and 16, respectively, consist of a simple three-way power splitter or junction 54 and a three-way power combinet, or junction 94, respectively, segments of cascaded impedance-transforming microstrip transmission lines 55, 56 and a 50-ohm phase equalization line 59 in the auxiliary branches 103 and 105; and microstrip transmission lines 55, 57 and 58 in the main branch. Microstrip transmission lines 55, 56, 59 and 55, 57, 58 in each cascade of lines are followed by an amplifier 64 in each branch together with input cascade short matching lines sections, or amplifier matching networks, 61 and 62 and output cascade short matching line sections, or amplifier matching networks, 66 and 67, respectively.

The frequency-selective branch network 14 contains three independent multisegment capactive end-coupled resonator filters 76, 77 and 82 of varying construction and electrical characteristics. The distributed-element configuration was chosen for its ease of implementation. It should be noted that lumped-element filter segments would be typically substituted for the distributed-element filter segments if space is a concern, such as in an on-chip realization.

The three-branch transversal filter 40 is composed of a 50-ohm input microstrip transmission line ("line" for short) 52, leading to a three-way splitter, or junction 54, that connects to three microstrip transmission lines, or impedance matching circuits. Each microstrip transmission line is effectively a quarter wavelength long at band center and consists of a combination of short and long cascaded lines 55, 56 and 55, 57, respectively, with characteristic impedances all in excess of 50 ohms. These short and long cascaded lines 55, 56, and 55, 57 are followed by 50-ohm phase equalization lines 58 and 59, respectively. It will be noted that the length of the equalization line segments 55, 57 and 58 in the main branch 107 differs from the equalization segments 55, 56 and 59 in each of the two auxiliary branches 103 and 105. This difference in length establishes the desired interference among branch signals. The phase equalization lines 58 and 59, respectively, are connected to amplitude equalizing gain modules, each composed of a MMIC variable gain amplifier or device 64 (Manufacturers Part No. EG 6345, manufactured by Texas Instruments, Inc. of Dallas, TX) located in between input and output amplifier matching circuits each of which is similarly composed of two cascaded short lines 61, 62 and 66, 67, respectively, of appropriate lengths and characteristic impedances to impedance match the MMIC devices 64 to 50 ohms at the amplifier inputs 63 and outputs 65. The output amplifier matching network 66, 67 is connected to a second set of phase equalizing 50-ohm lines 68 and 69, respectively, followed by capacitively end-coupled resonator filters 76, 77 and 82 in each of the three branches 103, 105 and 107. The capacitively end-coupled resonant filters 76, 77 and 82 are thereafter connected to a third set of phase equalizing and impedance transforming lines 88, 88*a*, 88*b*; 89, 89*a*, 89*b*; and 95, 95*a*, 95*b* in the output coupling network 16; which connect to the output three-way combinet 94.

The line segment impsdances and lengths are so selected as to transform the three filter output impedances into a composite 50-ohm overall output impedance at band center at the three-way combiner 94. For the end-coupled resonator filters 76, 77 and 82, the two in the auxiliary branches 76 and 77 possess two quasi-half-wave sections 74 and 75, respectively, and one approximately quarter-wave long spacer section 78, all separated by gaps 72 of equal dimensions. The main branch filter 82 has two quasi-half-wave sections 99 with equal end gaps 79 and one wider center gap 73.

Figure 4:
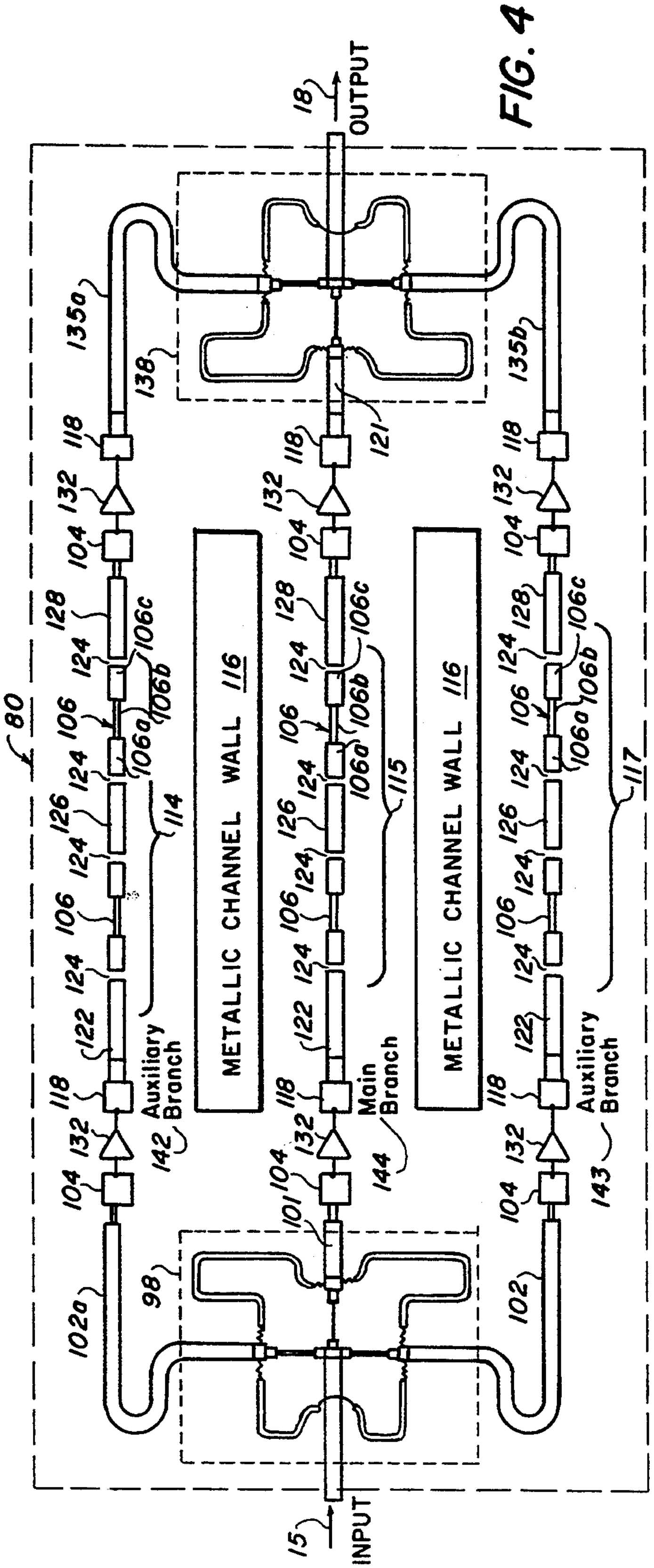
FIG. 4 depicts the microstrip layout of the Mark II 1% bandwidth three-branch transversal bandpass filter with isolation resistors.

In a third preferred embodiment, a mask layout of a 1% bandwidth three-branch transversal bandpass filter with power splitter 98 and power combiner 138 isolation resistors, 80, referred to as the Mark II (Mk II), is shown in FIG. 4. The design and construction of this embodiment is similar to that of the previously discussed Mk I embodiment 40.

Figure 4A:
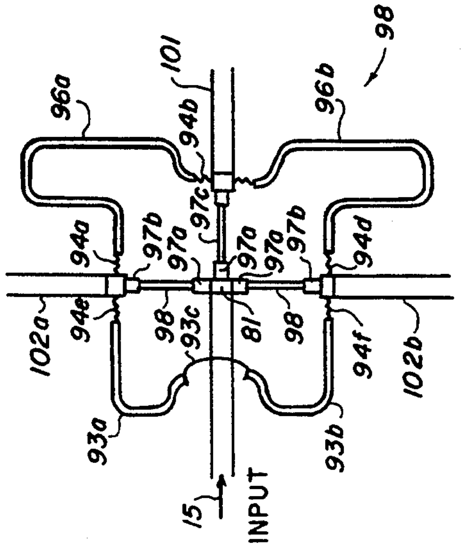
Figure 4B:
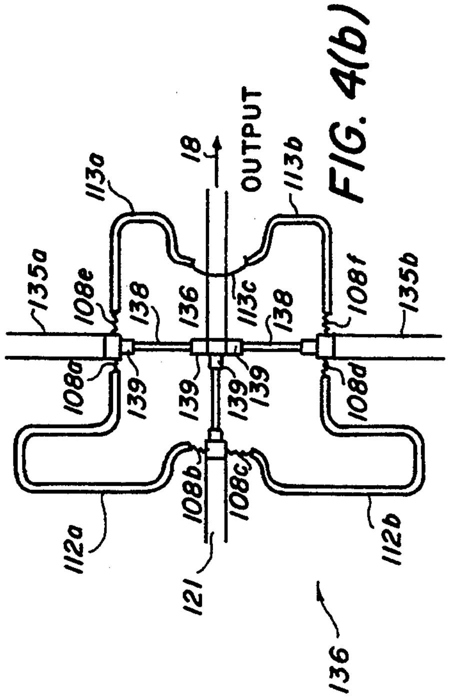

Referring to FIGS. 4*a* and 4*b*, the difference between the Mark I 40 and the Mark II 80 is the incorporation of an input assembly 98 and an output assembly 138 at the input 15 and output 18, respectively. The first arrangement in the input assembly 98 is comprised of isolation resistors 94*a*, 94*b*, and line section 96*a*; and is connected to the line segment 102*a* of the auxiliary branch 142 and the line segment 101 of the main branch 144. The second arrangement in the input assembly 98 is composed of isolation resistors 94*c*, 94*d* and line section 96*b*; and is connected to the line segment 101 of the main branch 144 and the line segment 102*b* of the auxiliary branch 143. The third arrangement in the input assembly 98 is composed of the isolation resistors 94*e*, 94*f* and two segments of line 93*a* and 93*b* are connected at the center point by a jumper wire 93*c*; and terminated at the line segments 102*a* and 102*b* of the auxiliary branches 142 and 143, respectively. At the output 18, a similar circuit exists. The first arrangement of the output assembly 138 is comprised of the isolation resistors 108*a*, 108*b* and line segments 112*a*; connected to the line segment 135*a* of the auxiliary branch 142 and line 121 of the main branch 144. The second arrangement of the output assembly 138 consists of isolation resistors 108*c*, 108*d* and line segment 112*b*; and is connected between the line segment 121 of the main branch 144 and line segment 135*b* of the auxiliary branch 143. The third arrangement in the output assembly 138 is composed of isolation resistors 108*e*, 108*f* and line segments 113*a*, 113*b* connected at the center point by a jumper wire 113*c*; and connected to the line segment 135*a* of the auxiliary circuit 142 and line segment 135*b* of the auxiliary circuit 143. The input 98 and output 138 assemblies of the design act as a three-way Wilkinson-type power splitter/combiner with signal isolation achieved among the ports of the main 144 and auxiliary 142, 143 branches facing the branch filters 115, 114, 117.

The three branch filters 114, 117 and 115 are of similar construction to the filters 76, 77 shown in the auxiliary branches 103, 105 of the Mk I embodiment 40 of FIG. 3, with varying gap widths 124, resonator lengths 106 and line lengths, 126, but with the difference that a stepped impedance (dog-bone) resonator 106 is substituted for each quasi-half-wave section. Each "dog-bone" resonator 106 is comprised of a high-impedance line 106*b* inserted between two 50-ohm lines 106*a* and 106*c* and shifts 2nd harmonic parasitic satellite bands to higher frequencies. It is to be noted, that all dogbone sections 106 are of different lengths with different resonant frequencies and passbands, the construction of which is well-known in the art.

Further, in the Mk II 80 version one or more sets of amplifiers, or gain modules, 132, of identical construction to those in the Mk I version 40, are provided between the branch filters 114, 115, 117 with input and output matching circuits 104 and 118 and phase equalizing 50-ohm lines 118, 135*a*, 135*b*. The additions of the additional amplifier 104 add isolation and gain to the circuit. Also, to prevent signal interaction between the auxiliary branches 142, 143 and the main branch 144, metallic branch walls 116 are placed equidistant between the branches 142, 143 144.

Figure 5:
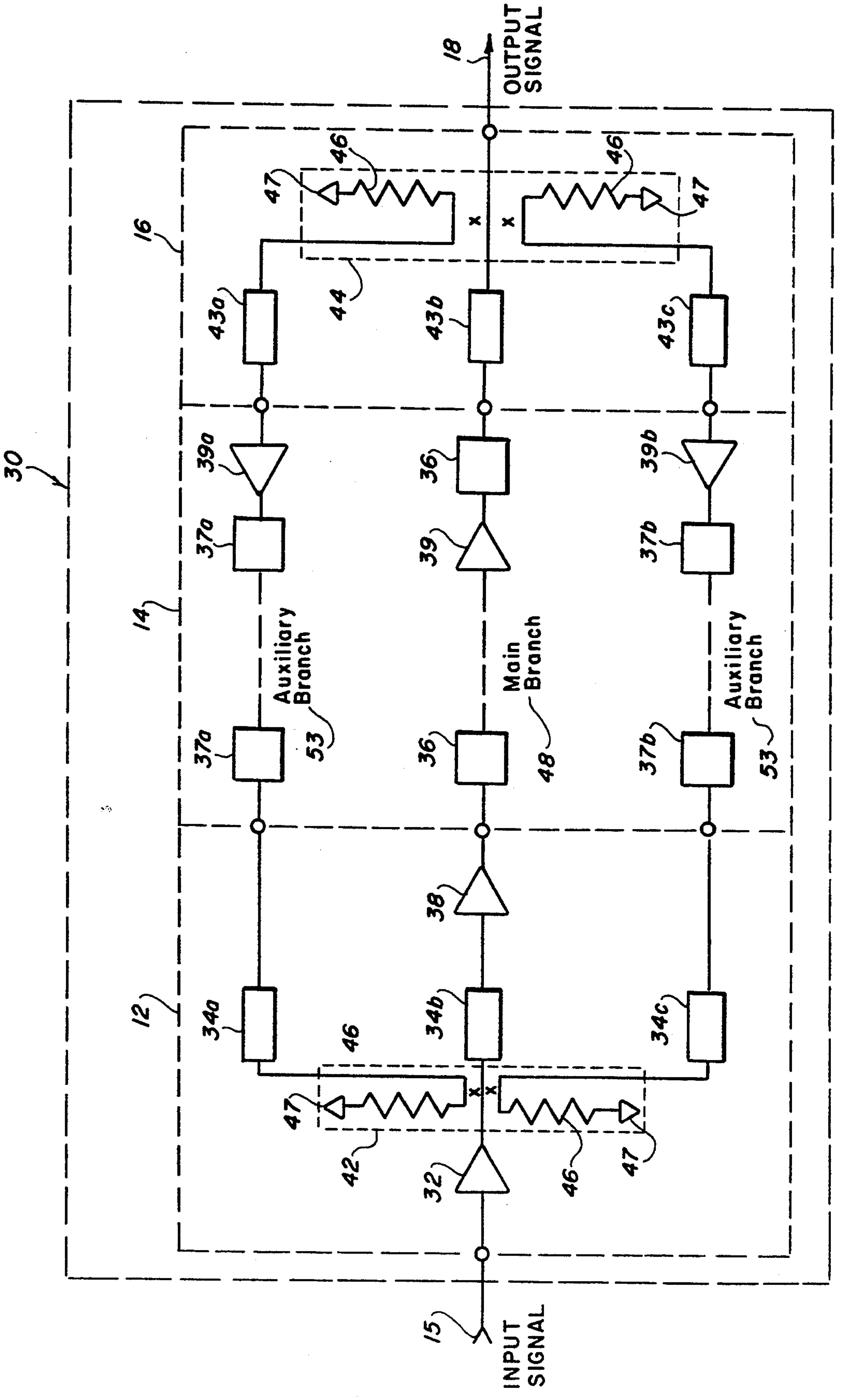
FIG. 5 is a schematic block diagram of an exemplary three-branch recursive filter.

In a fourth preferred embodiment, FIG. 5, a three-branch recursive filter 30 is shown. The three-branch recursive filter 30 is distinguished from the three-branch transversal filter 20, shown in FIG. 2, in that the signal components are transmitted in both forward and reverse directions, instead of only in the forward direction as in the transversal filter 20. The signal directions are maintained with appropriately oriented active devices having nonreciprocal transmission properties. The filtration process in FIG. 5 is assisted by the use of directional couplers 42 and 44 and active elements in the input 12 and output 16 coupling networks, and the frequency-selective branch network 14.

Referring to FIG. 5, the input signal 15 is passed to the frequency-selective branch network 14 through a preamplifier 32 (Manufacturers Part No. TGA 8021, manufactured by Texas Instruments, Inc. of Dallas, TX), directional coupler 42, and transmission line segment 34*b*. The transmission line segments 34*a*, 34*b* and 34*c* operate to provide impedance matching to the nominally 50-ohm port impedance of the frequency-selective branch network 14 and to provide signal phasing. In the main branch 48, the signal is further amplified by an amplifier 38 to compensate for filter transmission losses before being connected to the frequency-selective branch network 14.

In the main branch 48, the signal passes through one or more filter segments 36 and amplifiers 39 to transmission line segment 43*b* where the impedance is matched to that of the output directional coupler 44. In the output coupler 44, a portion of the signal is detected and fed back, through auxiliary branches 53 to the input directional coupler 42. In the input directional coupler 42 the fed-back signal is combined with the original input signal 15 carried by the main branch 48 to achieve frequency-selective constructive and destructive signal interactions. The signals appearing at the isolation ports of the input and output directional couplers 42 and 44, respectively, are grounded at 47 through termination resistors 46.

The feedback signals taken from the output coupler 44 are matched in impedance by transmission line segments 43*a*, 43*c* before being amplified by one or more amplifiers 39*a*, 39*b* prior to being filtered by one or more filter segments 37*a*, 37*b*. After the feedback signal passes through the filter segments 37*a*, 37*b*, the impedance is matched to the impedance of the input directional coupler 42 by transmission line segments 34*a* and 34*c*. Passing through input directional coupler 42, portions of the feedback signals are recombined with the input signal 15 to complete the recursive loop. The transmission line segments 34*a*, 34*c* in the auxiliary branches 53 differ in length from transmission line segment 34*b* in the main branch 48 to properly match the impedance of the input signal 15 to the main and auxiliary branches 48 and 53, respectively. The design of these impedance matching circuits is well known to individuals practicing in the art.

Figure 6:
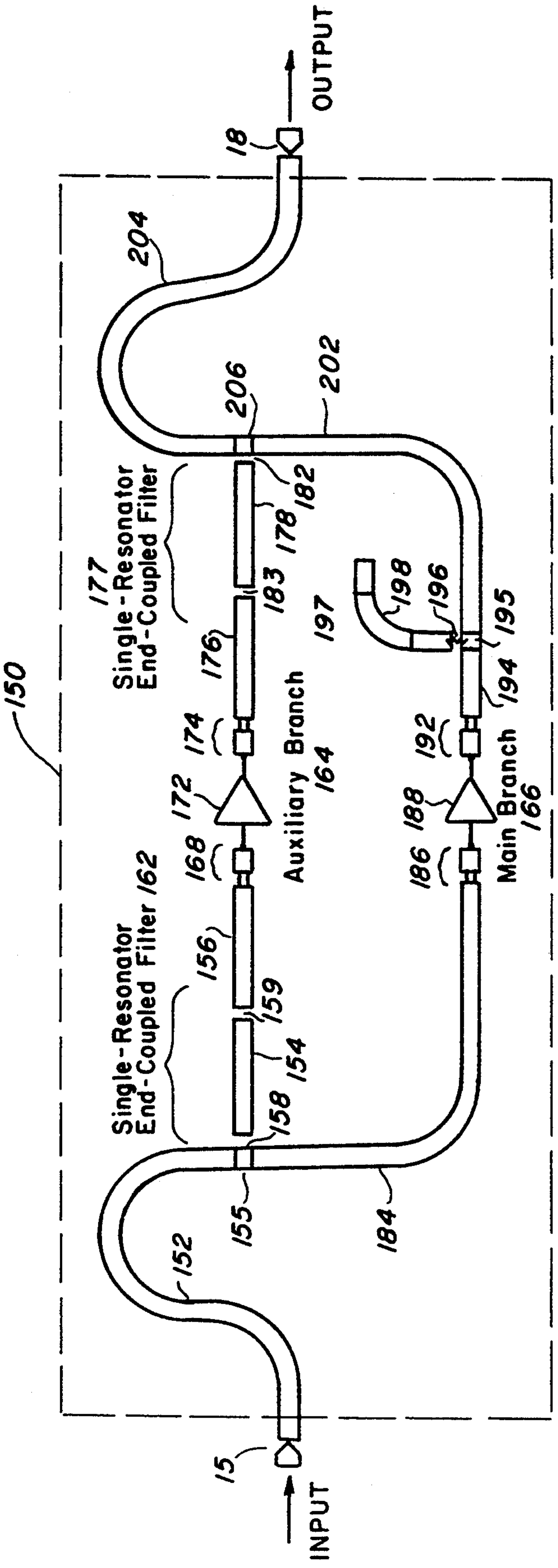
FIG. 6 is a schematic circuit diagram of an exemplary two-branch band-reject transversal filter.

A fifth preferred embodiment of the filter is the 0.5%-3dB bandwidth two-branch band-reject transversal filter 150 shown in FIG. 6. Signal rejection is achieved through destructive signal interaction between the signal in the main branch 166 and the signal transmitted through the resonant auxiliary branch 164, with the sharpness of the notch determined by the appropriate amplitude weighting of both signals for cancellation and the phase slope differential between the main branch 166, and resonant auxiliary branch 164 in the vicinity of resonance of employed bandpass filters.

In this embodiment, the input signal 15 is transmitted through a 50-ohm impedance line segment 152 connected to the main and auxiliary branches 166, 164, respectively, of the transversal filter. In the auxiliary branch 164, the signal 15 from the line segment 152 is connected to the auxiliary branch 164 through connection point 155 and filtered by two filter segments 162, 177 separated by a MMIC variable gain amplifier 172 (Manufacturers Part No. EG-6345). The first filter segment 162 is separated from the input 50-ohm impedance line 152 by a gap 158. This first filter segment is a single-resonator end-coupled filter 162 consisting of a microstrip half-wave resonator 154. The filter segment 162 is so designed so as to produce a narrow bandpass single-resonant response. A 50-ohm line segment 156 is separated from the half-wave resonator 154 by a gap 159. An amplifier input matching circuit 168 is connected to the 50-ohm segment 156 and matches the circuit impedance at resonance to the input impedance of the MMIC variable gain amplifier 172. The amplifier 172 transmits the signal through an output matching circuit 174 to a second 50-ohm line segment 176 to match the impedance to the second filter segment 177. This filter segment 177 also consists of a microstrip half-wave resonator 178. In the second filter segment 177 the half-wave resonator 178 is isolated with gaps 182 and 183 from line segment 176 and the connection point 206 where the outputs of main and auxiliary branches 164, 166, respectively, reconnect with the final line segment 204.

In the main branch 166, the signal from the input line segment 152 is connected at connection point 155 to an input matching circuit 186 through a second line segment 184 to match the impedance to the MMIC variable gain amplifier 188 by the matching segment 186. Amplification compensates for losses in the main branch 166. The output of the amplifier 188 is matched with an amplifier output matching circuit 192 to a third line segment 194. Connected to the third line segment 194, at a connection point 195, is an amplitude equalization network 197 composed of a 100-ohm ballast resistor 196 and a half-wave 50-ohm open-circuited stub 198. The purpose of the equalization network is to flatten out the amplitude ripple inherent in the MMIC variable gain amplifier 188. A third line segment 202 in the main branch 166 between connection point 195 and connection point 206 matches the impedance of the output of the main branch 166 to the output line 204 where the output of the auxiliary branch 164 and the output of the main branch 166 are combined through line 204 to provide the filtered output 18.

In modifications of the above-described preferred embodiments, a tuned filter replaces filter blocks 24*a*, 24*b* and 24*c* in FIG. 2 and filter blocks 36, 37*a* and 37*b* in FIG. 5 with tuned resonator filters. Such tuned resonator filters may be either bandpass or bandreject filters and may be either of the voltage-tuned or of the magnetically-tuned ferrite-based type.

Figure 7A:
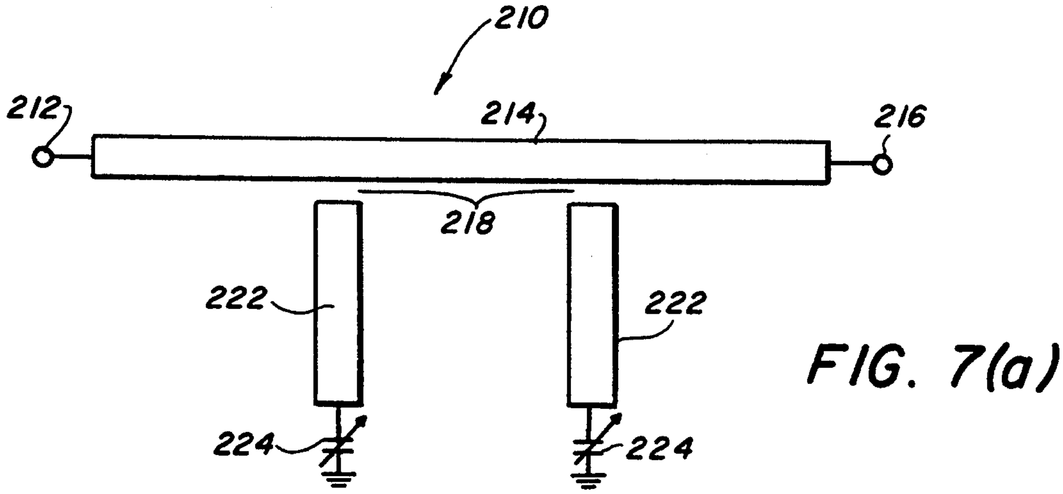
FIG. 7(*a*) is a schematic for a varactor-tuned band-reject filter.
Figure 7B:
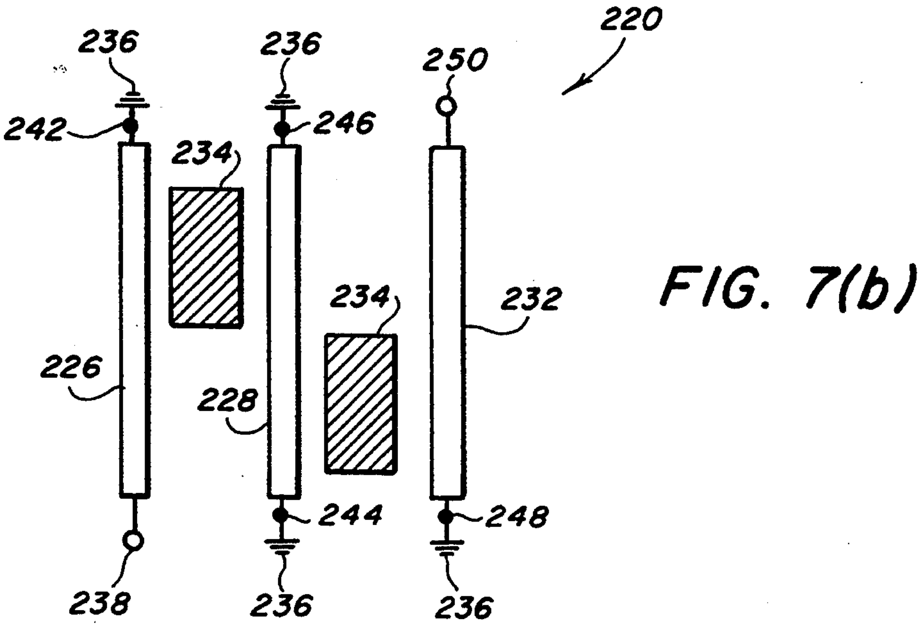

An exemplification of the voltage-tuned filter is a filter having voltage-tuned capacitive elements (such as varactor diodes) coupled to fixed resonator structures, such as the vatactor-tuned band-reject filter 210, as shown in FIGS. 7(*a*). The input 212 and output 216 of the filter are connected to a microstrip line 214, which in turn connects to a pair of quarter-wave microstrip resonators 222 through capacitive coupling gaps 218, with the resonators 222 connected to ground at their other ends through varactors 224.

Another type of tuned filter uses magnetically-tuned resonators (such as yttrium-iron-garnet (YIG) resonators) that are frequency-tuned through application of a variable magnetic field. These are commonly called magnetically-tuned YIG-based filters. One example of such a filter is the multi-pole planar YIG-based bandpass filter 220 shown in FIG. 7(*b*), which filter consists of three microstrip coupling lines 226, 228 and 232, respectively, separated by two YIG patch resonators 234, over a ground plane 236. The first microstrip coupling line (the input microstrip coupling line) 226 has the circuit input 238 at one end and the other end 242 is grounded. The second microstrip coupling line (inter-resonator coupling line) 228 is grounded at both ends 244 and 246, respectively. The third microstrip coupling line (output microstrip coupling line) 232 is grounded at one end 248 and has the circuit output 250 at the other end. The design of such filters is well known among individuals skilled in the art and need no further detailed discussion. SEE, G.L. Matthaei et al., *Microwave Filters, Impedance-Matching Networks, and Coupling Structure,* McGraw-Hill, pg. 1043, and Hunter et al., *Electronically Tunable Microwave Bandstop Filters,* Trans. Microwave Theory and Tech., IEEE, Vol MTT-30, No. 9, pp. 1361–1367, September 1982.

Each branch of the modifications to the above-described embodiments 20, 30, 40 and 150, or selected ones, may also include optional phase shifters (not shown) to provide variable phase shift among transversal and recursive branch signals as the filter center- or cut-off-frequency or bandwidth is tuned. Such tuning is needed to maintain proper phasing relationships among branch signals to achieve required constructive and destructive signal interferences across the filter frequency tuning band and achieve a specified filtering characteristic across the tuning band. Phase shifters (not shown) may be part of the frequency-selective branches 14 or be incorporated into the input and output coupling networks 12, 16, respectively, FIG. 1. The design and construction of phase shifters (not shown) are well known to those skilled in the art, and comprise a wide variety of implementations, including in the MMIC form.

It will be noted that in the embodiments of the invention, the auxiliary branch filters are narrow bandpass filters, each made up of a single resonator or multiple ones with sharp resonant behavior and rapid phase changes in the vicinity of band center. This permits the effects of auxiliary signal paths to be concentrated in a narrow frequency interval, such as around the designated cut-off frequency of a transversal or recursive filter characteristic to be synthesized. As an example, a rapid, readily achievable phase variation with a total phase differential of 180 degrees or so can be utilized to provide a sharp boost to main-signal-path transfer characteristics at a given critical frequency immediately followed by a sharp dip or null, and vice versa. Consequently, sharp composite filter skirts can be achieved with only a relative small number of signal branches. The savings in number of branches and in required cumulative time delay offered by the invention are particularly apparent in narrowband situations.

Although the individual branches of the various embodiments may appear to be similar in construction, however, the various elements of the filters have different line lengths because their filter passband center frequencies differ. Also, gaps between various elements of main branches always differ from those found in the auxiliary branches. The feeder line lengths in the input and output coupling networks that distribute the signal to the branch networks and collect the signals from them always differ because of the phase differences in the individual branches.

In all embodiments, the line lengths and characteristic impedances may be determined with computer-aided design tools so that all sections work together to yield the desired transversal filtering effects in the selected frequency band. The specific parameter values are not unique and, therefore, are not related to the invention as they will vary from case-to-case.

The first truly practical microwave active filter design concept is promised by this invention. It has direct application to receiver systems of all kinds, including RADAR, Electronic Warfare systems, and communications systems—terrestrial, airborne, and space-based. With the ability to readily achieve bandwidths of one percent and less in a compact and unconditionally stable fashion, the invention promises to have a particularly strong impact on the design of communications systems. The invention spans virtually all implementation technologies, including hybrid-circuit and MMIC designs, and including distributed-element, lumped-element, and mixed-element designs. Any filtering scheme falls within the scope of the current invention that employs nonreciprocal feedforward and/or feedback auxiliary signal branches with frequency-selective magnitude and phase characteristics. However, not all branches need to be frequency-selective and nonreciprocal.

High-order filter transfer functions can be achieved through appropriate parallel-, series-, and cascade-connections of filter building blocks designed in accordance with the basic invention.

While maintaining all of the advantages of the U.S. Pat. No. 4,661,789 transversal and recursive filter (i.e., not susceptible to oscillation, not requiring high-gain amplification, and tolerant to long signal time delays intrinsic to available active elements), the invention extends the approach to narrowband (1% to 10% fractional bandwidth) and ultra-narrowband (1.0% and less fractional bandwidth) filters with MMIC compatibility. When utilized in hybrid configurations, the present invention allows a buildingblock approach to filter design through utilization of off-the-shelf MMIC amplifiers—an option thus available at microwave frequencies for the first time.

The present invention distinguishes itself from the prior art by including filter sections with pronounced frequency selectivity (not just sections used for low-Q, nonresonant impedance matching purposes) in auxiliary feedforward and/or feedback branches of the overall filter network that are each common to only one transversal or recursive auxiliary signal path. These branches may, but do not have to, include a nonreciprocal gain device, such as an amplifier, to provide directionality and compensate for passive component losses, in addition to establishing proper signal weighting distribution.

The present invention should not be confused with so-called directional filters. This type of filter is based upon transversal type operation with two frequency-selective branches. Unlike the present invention, directional filters are reciprocal circuits, and thus do not actually fall into the transversal filter category. Also, the present invention should not be confused with transversal and recursive filters found in the prior art that achieve required phase differences among branch signal components by employing passive filter sections in lieu of traditional uniform delay line segments. Such filter sections have been used not only to satisfy signal phasing requirements as substitutes for transmission line sections, but also, to shape overall magnitude responses. However, filter sections used in prior art situations have remained exclusively associated with portions of a transversal or recursive filter that distribute signal components to respective feedforward or feedback branches, rather than directly incorporated into such branches, as in the current invention.

Numerous modifications and adaptations of the present invention will be apparent to those skilled in the art. Thus it is intended that the following claims cover all modifications and adaptations which fall within the true spirit and scope of the present invention. Although the invention has been described in relation to various exemplary preferred embodiments thereof, it will be understood by those skilled in the art that still other variations and modifications can be affected in other embodiments without detracting from the scope and spirit of the invention.

What is claimed is:

1. A filter comprising:

coupling means for receiving an input signal in the microwave frequency spectrum and dividing said input signal into a plurality of portions, each portion of said plurality of portions of input signal being applied to a predetermined output port of a plurality of output ports of said coupling means;

filter means for receiving said plurality of portions of said input signal from said coupling means into a primary signal branch and one or more auxiliary signal branches, each branch having active circuits for transmission amplitude variations and passive circuit elements for transmission phase variation with frequency to provide filtering said plurality of portions of said input signal as a function of the microwave frequency to produce a plurality of filtered portions; and output means for receiving said plurality of filtered portions of said input signal from said filter means and combining said plurality of filtered portions of said input signal into a composite filtered signal output.

2. A filter, as in claim 1, wherein said coupling means further comprises:

means for distributing each of said plurality of portions of said input signal to said predetermined output port of said plurality of output ports of said coupling means.

3. A filter, as in claim 1, wherein said filter means comprises:

a plurality of primary ports for receiving said input signal from said coupling means, each port of said plurality of primary ports of said filter means individually connected to a preselected output port of said plurality of output ports of said coupling means;

a plurality of secondary ports of said filter means corresponding to each of said primary ports of said filter means;

a signal channel between each of said plurality of primary ports of said filter means and the corresponding secondary port of said filter means comprised of individual filter subnetworks.

4. A filter, as in claim 1, wherein the output means comprises;

a plurality of primary ports for receiving said filtered input signal output from said primary signal branch and one or more auxiliary signal branches of said filtering means, each primary port of said output means being individually connected to a preselected secondary port of said filter means;

means for combining each of said plurality of filtered input signals incident on said primary ports of said output means into a composite filtered signal; and a secondary port of said output means for outputting said composite filtered signal.

5. A filter, as in claim 3, wherein one or more of said individual subnetworks of the signal channel possess bandpass characteristics and pass a narrow-band range of frequencies of 1% to 10% fractional bandwidth.

6. A filter, as in claim 3, wherein one or more of said individual subnetworks of the signal channel have bandpass characteristics and pass an ultra-narrow-band of frequencies 1.0% or less of the fractional bandwidth.

7. A filter, as in claim 3, wherein said signal channels are nonreciprocal feedforward signal channels with frequency-selective transmission magnitude frequency-dependent transmission phase characteristics.

8. A filter, as in claim 1, wherein said coupling and output means are further comprised of an input power splitter and an output power combiner, respectively, that utilize isolation resistors.

9. A filter, as in claim 1, wherein said coupling and output means are further comprised of an input power splitter and an output power combiner, respectively, that do not utilize isolation resistors.

10. A filter, as in claim 1, wherein said filter is a transversal-type band-reject filter.

11. A filter, as in claim 3, wherein the passive circuit elements of the individual filter subnetworks are comprised of distributed circuit elements.

12. A filter, as in claim 3, wherein the passive circuit elements of the individual filter subnetworks are comprised of lumped circuit elements.

13. A filter, as in claim 3, wherein the circuit elements are selected from a group comprised of lumped circuit elements, distributed circuit elements and combinations of lumped and distribute circuit elements.

14. A filter, as in claim 3, wherein the passive circuit elements of the individual filter subnetworks are comprised of a plurality

15. A filter, as in claim 3, wherein the individual circuit elements are comprised of at least one voltage-tuned filter subnetwork.

16. A filter, as in claim 3, wherein the individual circuit elements are comprised of at least one magnetically-tuned ferrite-based filter subnetwork.

17. A filter, as in claim 3, wherein the active elements are microwave monolithic integrated circuits (MMICS).

18. A filter, as in claim 3, wherein the signal channels of the filter means are comprised of hybrid-circuit filter structures.

19. A filter as in claim 3, wherein the said individual filter subnetworks contains at least one frequency-tuned resonator filters.

20. A filter, as in claim 1, wherein said filter is a transversal-type bandpass filter.

21. A filter comprising:

input coupling means for receiving an input signal in the microwave frequency spectrum and one or more feedback signals, and combining said input signal and one or more feedback signals so as to form a combined input signal;

filter means for receiving, feeding forward and filtering said combined input signal or portions thereof in one or more separate feedforward signal channels comprised of branch filter subnetworks, and for receiving, feeding back and filtering one or more feedback signals in one or more signal channels comprised of auxiliary branch subnetworks for application to said input coupling means;

output means for receiving said filtered combined input signal or portions thereof from the feedforward signal channel filter subnetworks of the filter means and producing an output signal, and further comprising a means for feeding back one or more feedback signals to said one or more auxiliary branch networks of said filter means.

22. A filter, as in claim 21, wherein said input coupler is further comprised of an input directional coupler for combining the input signal and one or more feedback signals, a plurality of impedance matching means providing impedance-matched signal paths for the input signal, feedback signals, and combined signal or portions thereof, and appropriately oriented active devices having nonreciprocal transmission characteristics to maintain proper direction of flow of the input signal, feedback signal and combined input signal or portions thereof.

23. A filter, as in claim 21, wherein said feedforward and feedback signal channels of said filter means are comprised of active and passive circuit elements.

24. A filter, as in claim 23, wherein said feedforward and feedback signal channels of said filter means are comprised of nonreciprocal feedforward signal channels and nonreciprocal feedback signal channel, respectively, with frequency-selective transmission magnitude and frequency-dependent transmission phase characteristics.

25. A filter, as in claim 21, wherein said output means is further comprised of an output directional coupler feeding back a portion of the filtered combined input signal to one or more of the feedback signal channels of the filter means, impedance matching means providing impedance matched signal paths for the filtered combined input signal or portions thereof received from the filter means, the one or more feedback signals applied to the filter means from the output directional coupler; and the output signal of the filter.

26. A method for limited-bandwidth filtration of microwave signals comprising the steps of:

receiving an input signal into a signal coupler;

combining said input signal with one or more feedback signals to produce a combine input signal;

applying said combined input signal or portions thereof to one or more frequency-selective feedforward branch networks for signal filtration;

feeding back a portion of the filtered combined input signal through one or more frequency-selective feedback branch networks where it is further filtered and combined with the input signal in the input coupler; and applying the remaining portion of the combine filtered input signal to an output port as an output signal.

27. A filter, as in claim 1, wherein said filter is a transversal-type lowpass filter.

28. A filter, as in claim 1, wherein said filter is a transversal-type highpass filter.

* * * * *